(12) United States Patent
Takahashi et al.

(10) Patent No.: US 7,915,946 B2
(45) Date of Patent: Mar. 29, 2011

(54) SWITCH CIRCUIT FOR HIGH FREQUENCY SIGNALS WHEREIN DISTORTION OF THE SIGNALS ARE SUPPRESSED

(75) Inventors: Yuji Takahashi, Tokyo (JP); Keiichi Numata, Tokyo (JP)

(73) Assignee: NEC Corporation, Tokyo (JP)

( * ) Notice: Subject to any disclaimer, the term of this patent is extended or adjusted under 35 U.S.C. 154(b) by 53 days.

(21) Appl. No.: 12/301,488

(22) PCT Filed: May 22, 2007

(86) PCT No.: PCT/JP2007/060408
§ 371 (c)(1),
(2), (4) Date: Nov. 19, 2008

(87) PCT Pub. No.: WO2007/136050
PCT Pub. Date: Nov. 29, 2007

(65) Prior Publication Data
US 2009/0206910 A1    Aug. 20, 2009

(30) Foreign Application Priority Data

May 23, 2006  (JP) ................ 2006-142575
Mar. 27, 2007  (JP) ................ 2007-081695

(51) Int. Cl.
*H03K 17/60* (2006.01)
(52) U.S. Cl. ......... 327/427; 327/434; 333/101; 333/103
(58) Field of Classification Search .............. 327/427, 327/434; 333/101–103
See application file for complete search history.

(56) References Cited

U.S. PATENT DOCUMENTS

| | | | |
|---|---|---|---|
| 6,642,578 B1 * | 11/2003 | Arnold et al. | 257/341 |
| 7,106,121 B2 * | 9/2006 | Hidaka et al. | 327/308 |
| 7,138,846 B2 * | 11/2006 | Suwa et al. | 327/308 |
| 7,173,471 B2 * | 2/2007 | Nakatsuka et al. | 327/308 |
| 7,345,521 B2 * | 3/2008 | Takahashi et al. | 327/308 |
| 7,423,499 B2 * | 9/2008 | Adachi et al. | 333/103 |
| 7,492,209 B2 * | 2/2009 | Prikhodko et al. | 327/384 |

FOREIGN PATENT DOCUMENTS

| | | |
|---|---|---|
| JP | 07-058563 | 3/1995 |
| JP | 08-139014 | 5/1996 |
| JP | 08-195667 | 7/1996 |
| JP | 08-228138 | 9/1996 |
| JP | 11-234106 | 8/1999 |
| JP | 11-239048 | 8/1999 |
| JP | 2004-048411 | 2/2004 |
| JP | 2004-320439 | 11/2004 |
| JP | 2005-006143 | 1/2005 |
| JP | 2005-323030 | 11/2005 |

OTHER PUBLICATIONS

International Search Report dated Jul. 10, 2007, in PCT Application PCT/JP2007/060408.

* cited by examiner

*Primary Examiner* — Kenneth B. Wells
(74) *Attorney, Agent, or Firm* — Young & Thompson

(57) ABSTRACT

A high-frequency switch circuit includes: a switch section comprised of a field effect transistor having a plurality of bias circuits and a potential generating circuit for generating bias voltages from a control signal and supplying them to the bias circuits. The field effect transistor forms the passage route of a high-frequency signal by turning on and off in accordance with the control signal. The bias circuits are provided to produce a potential difference between the drain terminal and the source terminal of the field effect transistor and to apply bias voltages lower than the voltage of the control signal to the drain terminal, and the source terminal.

13 Claims, 9 Drawing Sheets

US 7,915,946 B2

SWITCH CIRCUIT FOR HIGH FREQUENCY SIGNALS WHEREIN DISTORTION OF THE SIGNALS ARE SUPPRESSED

TECHNICAL FIELD

This application is based upon and claims the benefit of priority from Japanese patent application No. 2006-142575, filed on May 23, 2006, the disclosure of which is incorporated herein in its entirety by reference.

The present invention relates to a high-frequency switch circuit for passing or cutting off a high-frequency signal.

BACKGROUND ART

As a high-frequency switch circuit for passing or cutting off a high-frequency signal or for allowing a high-frequency signal to pass through, those using diodes and those using field effect transistors (FET: field effect transistor) have been conventionally known.

FIG. 1 is an example of a high-frequency switch circuit using FETs, a circuit diagram showing a high-frequency switch circuit configuration of a SPDT (single pole double through) type. Here, FIG. 1 is a circuit disposed in FIG. 1 of Japanese Patent Application Laid-open H08-139014.

The high-frequency switch circuit shown in FIG. 1 has a configuration including first switch section 121 and second switch section 122 for allowing a high-frequency signal to pass through or for cutting off a high-frequency signal.

First switch section 121 includes a plurality of FETs (four in FIG. 1) connected in series with its two ends connected to two high-frequency terminals 101 and 102. The gate terminal of each FET is connected to control terminal 111 via a resistance element. Similarly, second switch section 122 includes a plurality of FETs (four in FIG. 1) connected in series with its two ends connected to two high-frequency terminals 101 and 103. The gate terminal of each FET is connected to control terminal 112 via a resistance element. Here, high-frequency terminal 101 is shared by first switch section 121 and second switch section 122.

In the high-frequency switch circuit shown in FIG. 1, a high-level or low-level control signal is input to control terminal 111 of first switch section 121 and control terminal 112 of second switch section 122 so as to perform on/off control of first switch section 121 and second switch section 122. In this configuration, when two levels of control signals, high-level and low-level signals, are complementarily input to control terminal 111 and control terminal 112, it is possible to cause high-frequency terminal 102 or high-frequency terminal 103 to output the high-frequency signal input from high-frequency terminal 101, or cause high-frequency terminal 101 to output one of the high-frequency signals input from high-frequency terminal 102 and high-frequency 50 terminal 103.

In this high-frequency switch circuit of the prior art shown in FIG. 1, as described in paragraph 0009 in Japanese Patent Application Laid-open 2004-320439, for example, the value of the resistance between the drain and source of each FET that is in the off-state (off-state resistance) is extremely large, hence there is the problem that the potential between the drain and source terminals of each of the serially connected FETs becomes unstable.

To avoid this problem, a common practice is use of a technique that stabilizes the potential between the drain and source terminals by applying bias voltage Va to the drain terminals and source terminals of the FETs via resistance elements etc., as shown in FIGS. 2 and 3. The circuits shown in FIGS. 2 and 3 are circuits for allowing a high-frequency signal to pass through or are circuits for cutting off a high-frequency signal that passes between two high-frequency terminals T1 and T2 by turning on and off the FETs based on control signal Vc. Here, FIG. 2 is the circuit disclosed in FIG. 1 of the aforementioned Japanese Patent Application Laid-open 2004-320439 and FIG. 3 is the circuit disclosed in FIG. 1 of Japanese Patent Application Laid-open H11-239048.

In the high-frequency switch circuits using FETs as above, there is a problem in which the high-frequency signal having passed through the high-frequency switch circuit entails distortion.

Usually, the drain or source terminal of an FET provided in a high-frequency switch circuit is applied with a voltage having an amplitude in conformity with the intensity of the input high-frequency signal. At this time, in the on-state FET, the on-state resistance changes in accordance with the voltage of the input high-frequency signal while in the off-state FET, the off-state capacitance varies in accordance with the voltage of the input high-frequency signal. This phenomenon in which the FET on-state resistance and off-state capacitance vary depending on the input voltage causes distortion of the high-frequency signal that has passed through the high-frequency switch circuit.

SUMMARY

It is therefore an object of the present invention to provide a high-frequency switch circuit capable of reducing distortion that arises when a high-frequency signal passes through it.

In order to achieve the above object, an exemplary aspect of the invention is a high-frequency switch circuit for allowing a high-frequency signal to pass through or for cutting off a high-frequency signal in accordance with a control signal, and includes: a switch section including a field effect transistor that turns on and off in accordance with said control signal applied via a resistance element and forms the passage route of said high-frequency signal, and a plurality of bias circuits for applying different bias voltages that are lower than the voltage of said control signal so as to produce a potential difference between the drain terminal and the source terminal of said field effect transistor; and a potential generating circuit for generating said bias voltages from said control signal and supplying them to said bias circuits.

In the high-frequency switch circuit constructed as above, application of a voltage lower than the voltage of the control signal to the passage route of the high-frequency signal causes the potential at the RF node to become lower and the voltage applied to the gate terminal of the field effect transistor to become higher. As a result, the on-state resistance in the field effect transistor being in the on-state becomes lower, so that the variation of the on-state resistance of the field effect transistor relative to the variation in the voltage of the high-frequency signal input from the drain terminal or source terminal is suppressed. On the other hand, since the input resistance of the field effect transistor being in the off-state is high, the bias voltage is applied as it is to the drain terminal and source terminal so that it is possible to impart a potential difference between the drain and source terminals. As a result, the variation in the off-state capacitance of the field effect transistor relative to the voltage variation of the high-frequency signal input from the drain terminal or source terminal can be suppressed. Accordingly, it is possible to reduce distortion of the high-frequency signal that arises when the signal passes through the high-frequency switch circuit.

EXEMPLARY EMBODIMENT

Next, the exemplary embodiment of the present invention will be described with reference to the drawings.

The First Exemplary Embodiment

Figure 4:
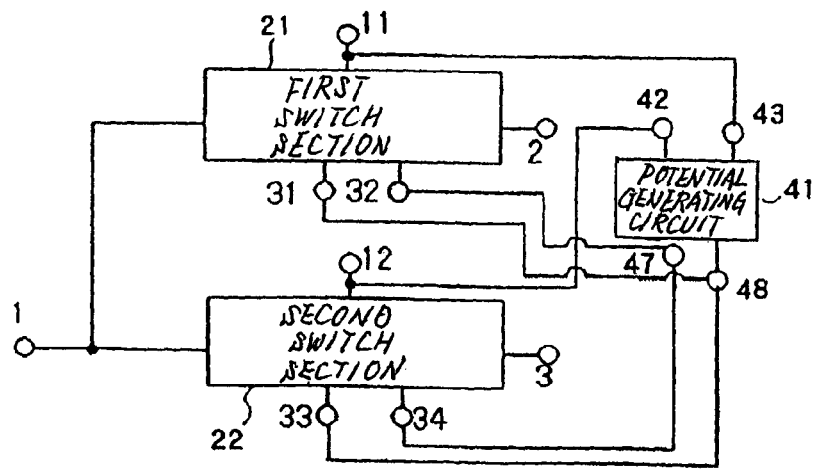
FIG. 4 is a block diagram showing a configuration of a high-frequency switch circuit of the first exemplary embodiment.

FIG. 4 is a block diagram showing a configuration of a high-frequency switch circuit of the first exemplary embodiment. Here, FIG. 4 is an example in which the configuration of the first exemplary embodiment is applied to a SPDT type high-frequency switch circuit.

As shown in FIG. 4, the high-frequency switch circuit of the first exemplary embodiment has a configuration including: first switch section 21 and second switch section 22 for allowing a high-frequency signal to pass or for cutting off a high-frequency signal; and a potential generating circuit 41 for supplying predetermined bias voltages to first switch section 21 and second switch section 22.

First switch section 21 is interposed between first high-frequency terminal 1 and second high-frequency terminal 2 for input and output of a high-frequency signal, and second switch section 22 is interposed between first high-frequency terminal 1 and third high-frequency terminal 3 for input and output of a high-frequency signal. First high-frequency terminal 1 is shared by first switch section 21 and second switch section 22.

First switch section 21 includes control terminal 11 to which a control signal for allowing a high-frequency signal to pass or for cutting off a high-frequency signal is input, and bias terminals 31 and 32 for supplying bias voltages to the circuit inside first switch section 21. Similarly, second switch section 22 includes control terminal 12 to which a control signal for allowing a high-frequency signal to pass or for cutting off a high-frequency signal is input, and bias terminals 33 and 34 for supplying bias voltages to the circuit inside second switch section 22.

Bias terminal 32 of first switch section 21 and bias terminal 34 of second switch section 22 are connected to output terminal 47 of potential generating circuit 41, and bias terminal 31 of first switch section 21 and bias terminal 33 of second switch section 22 are connected to output terminal 48 of potential generating circuit 41. Control terminal 11 of first switch section 21 is connected to input terminal 43 of potential generating circuit 41, and control terminal 12 of second switch section 22 is connected to input terminal 42 of potential generating circuit 41.

First switch section 21 turns on and off in accordance with the control signal input from control terminal 11. Similarly, second switch section 22 turns on and off in accordance with the control signal input from control terminal 12. Potential generating circuit 41 generates bias voltages based on the control signals input to control terminal 11 and control terminal 12 to supply them to first switch section 21 and second switch section 22, respectively.

First switch section 21 and second switch section 22 shown in FIG. 4 may use the circuits shown in FIGS. 5 through 13, for example.

FIGS. 5 through 13 are circuit diagrams showing specific examples of the first switch section and second switch section shown in FIG. 4. In the following description, the circuit configuration will be described taking first switch section 21 as the example, but second switch section 22 also has the same configuration.

Figure 5:
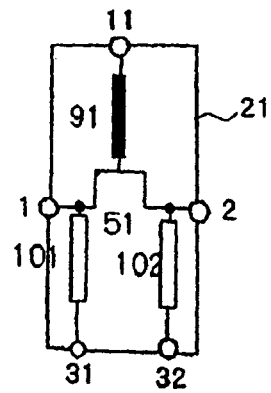
FIG. 5 is a circuit diagram showing a specific example of the first switch section and second switch section shown in FIG. 4.

The circuit shown in FIG. 5 has a configuration including FET 51 as the passage route of a high-frequency signal, resistance element 91, bias circuit 101 and bias circuit 102. The drain and source terminals of FET 51 are connected to first high-frequency terminal and second high-frequency terminal 2 while the gate terminal of FET 51 is connected to control terminal 11 via resistance element 91. Also, the drain terminal (or the source terminal) of FET 51 is connected to bias terminal 31 via bias circuit 101 and the source terminal (or the drain terminal) of FET 51 is connected to bias terminal 32 via bias circuit 102.

Figure 6:
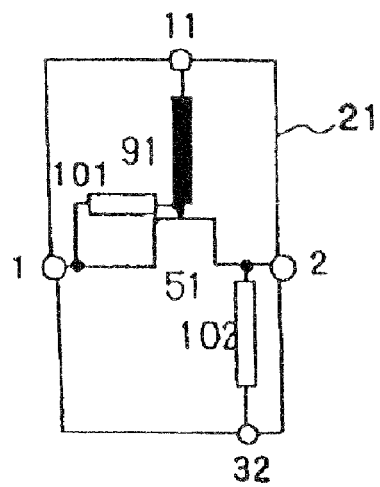
FIG. 6 is a circuit diagram showing a specific example of the first switch section and second switch section shown in FIG. 4.

The circuit shown in FIG. 6 has a configuration in which bias circuit 101 shown in FIG. 5 is connected between the drain terminal (or the source terminal) and the gate terminal of FET 51 while the source terminal (or the drain terminal) of FET 51 is connected to bias terminal 32 via bias circuit 102. The other configuration is the same as the circuit shown in FIG. 5. Here, it is also possible to provide a configuration in which bias circuit 102 is connected between the drain terminal (or the source terminal) and the gate terminal of FET 51 while the source terminal (or the drain terminal) of FET 51 is connected to bias terminal 31 via bias circuit 101. In the circuit shown in FIG. 6, bias terminal 31 that is unused may be set free. In the circuit shown in FIG. 6, a single bias terminal is enough.

Figure 7:
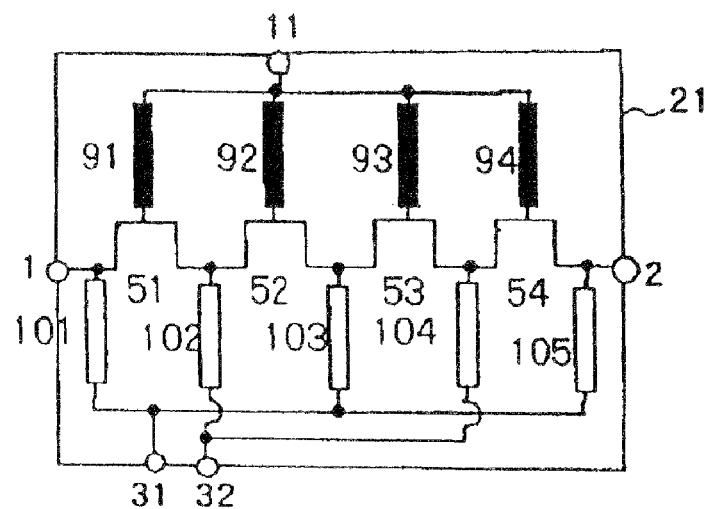
FIG. 7 is a circuit diagram showing a specific example of the first switch section and second switch section shown in FIG. 4.

The circuit shown in FIG. 7 has a configuration including four FETs 51 through 54 connected in series as the passage route of a high-frequency signal, four resistance elements 91 through 94 and four bias circuits 101 through 105. Both the ends of the series of FETs 51 through 54 are connected to first high-frequency terminal 1 and second high-frequency terminal 2. The gate terminals of FETs 51 through 54 are connected to control terminal 11 via respective resistance elements 91 and 94 while bias circuits 101 through 105 are connected to the respective junctions between the drain terminal and source terminal of FETs 51 through 54. The drain and source terminals of FETs 51 through 54 are connected to bias terminal 31 or bias terminal 32 via bias circuits 101 through 105. In the example shown in FIG. 7, bias circuits 101, 103 and 105 are connected to bias terminal 31 and bias circuits 102 and 104 are connected to bias terminal 32.

Figure 8:
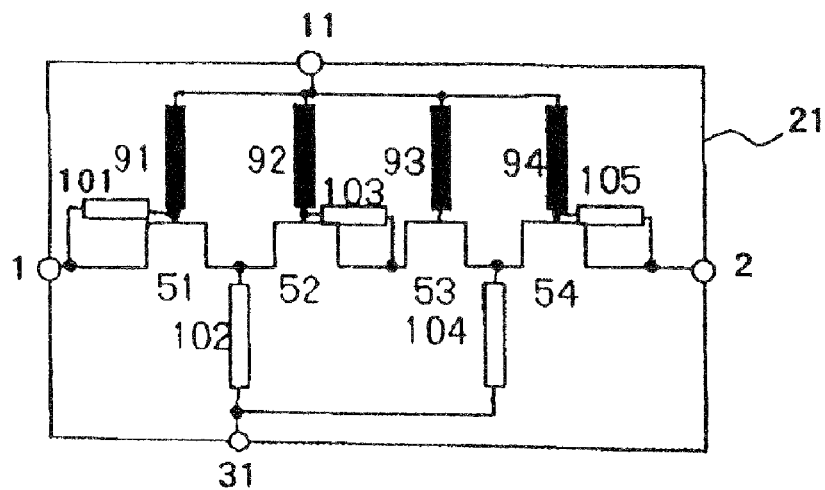
FIG. 8 is a circuit diagram showing a specific example of the first switch section and second switch section shown in FIG. 4.

The circuit shown in FIG. 8 has a configuration in which bias circuit 101 shown in FIG. 7 is connected between the drain terminal (or the source terminal) and the gate terminal of FET 51 while bias circuit 103 is connected between the source terminal (or the drain terminal) and the gate terminal of FET 52 and bias circuit 105 is connected between the source terminal (or the drain terminal) and the gate terminal of FET 54. The source terminal (or the drain terminal) of FET 51 is connected to bias terminal 31 via bias circuit 102, and the source terminal (or the drain terminal) of FET 53 is connected to bias terminal 31 via bias circuit 104. The other configuration is the same as the circuit shown in FIG. 7. Also in the circuit shown in FIG. 8, bias terminal 32 that is unused may be set free. Similarly to the circuit shown in FIG. 6, in the circuit shown in FIG. 8, a single bias terminal is enough.

Figure 9:
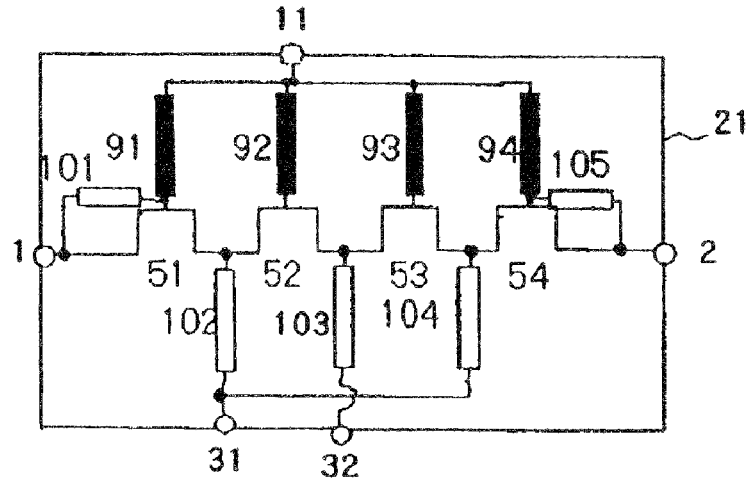
FIG. 9 is a circuit diagram showing a specific example of the first switch section and second switch section shown in FIG. 4.

The circuit shown in FIG. 9 has a configuration in which bias circuit 101 shown in FIG. 7 is connected between the drain terminal (or the source terminal) and the gate terminal of FET 51 while bias circuit 105 is connected between the source terminal (or the drain terminal) and the gate terminal of FET 54. Also, the source terminal (or the drain terminal) of FET 51 is connected to bias terminal 31 via bias circuit 102, the source terminal (or the drain terminal) of FET 52 is connected to bias terminal 32 via bias circuit 103, and the source terminal (or the drain terminal) of FET 53 is connected to bias terminal 31 via bias circuit 104. The other configuration is the same as the circuit shown in FIG. 7. Also in the circuit shown in FIG. 9, bias terminal 32 that is unused may be set free. Similarly to the circuit shown in FIG. 6, in the circuit shown in FIG. 9, a single bias terminal is enough.

Figure 10:
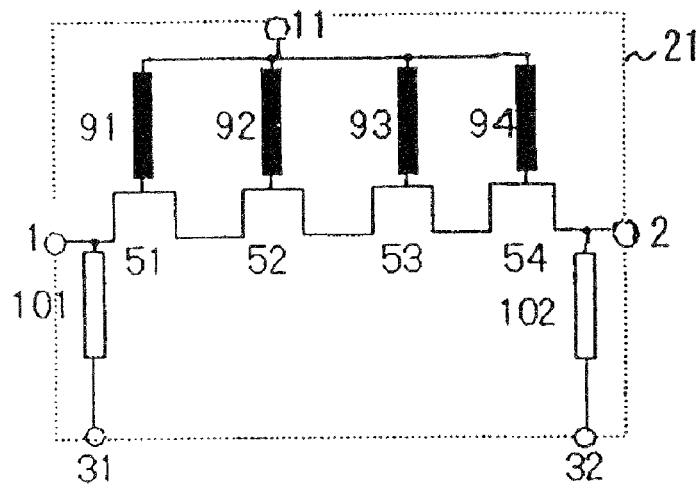
FIG. 10 is a circuit diagram showing a specific example of the first switch section and second switch section shown in FIG. 4.

The circuit shown in FIG. 10 has a configuration including four FETs 51 through 54 connected in series as the passage route of a high-frequency signal, four resistance elements 91 through 94 and two bias circuits 101 and 102. Both the ends of the series of FETs 51 through 54 are connected to first high-frequency terminal 1 and second high-frequency terminal 2. The gate terminals of FETs 51 through 54 are connected to control terminal 11 via respective resistance elements 91 and 94 while bias circuits 101 and 102 are connected to first high-frequency terminal 1 and second high-frequency terminal 2 located at both end of the serially connected FETs 51 through 54. The first high-frequency terminal is connected to bias terminal 31 via bias circuit 101 and the second high-frequency terminal is connected to bias terminal 32 via bias terminal 102.

Figure 11:
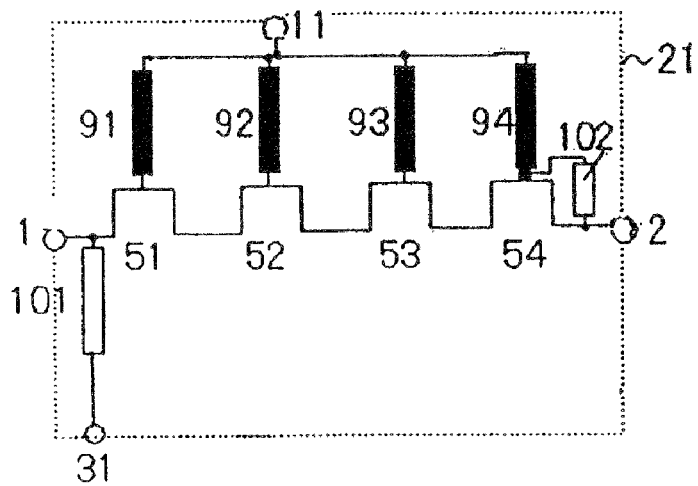
FIG. 11 is a circuit diagram showing a specific example of the first switch section and second switch section shown in FIG. 4.

The circuit shown in FIG. 11 has a configuration in which bias circuit 102 shown in FIG. 10 is connected between the drain terminal (or the source terminal) and the gate terminal of FET 54. The other configuration is the same as the circuit shown in FIG. 10. In the circuit shown in FIG. 11, bias terminal 32 that is unused may be set free. Similarly to the circuits shown in FIGS. 6 and 8, in the circuit shown in FIG. 11, a single bias terminal is enough.

Figure 12:
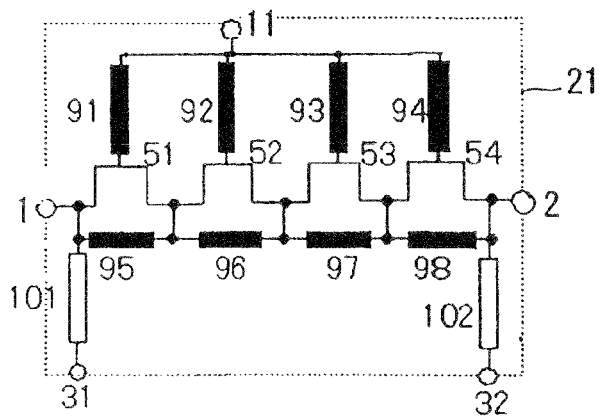
FIG. 12 is a circuit diagram showing a specific example of the first switch section and second switch section shown in FIG. 4.

The circuit shown in FIG. 12 has a configuration in which a resistance element is connected in parallel between the drain terminal and the source terminal of each of four FETs 51 through 54 shown in FIG. 10. Resistance element 95 is connected between the drain terminal and the source terminal of FET 51, resistance element 96 is connected between the drain terminal and the source terminal of FET 52, resistance element 97 is connected between the drain terminal and the source terminal of FET 53, and resistance element 98 is connected between the drain terminal and the source terminal of FET 54. The other configuration is the same as the circuit shown in FIG. 10.

Figure 13:
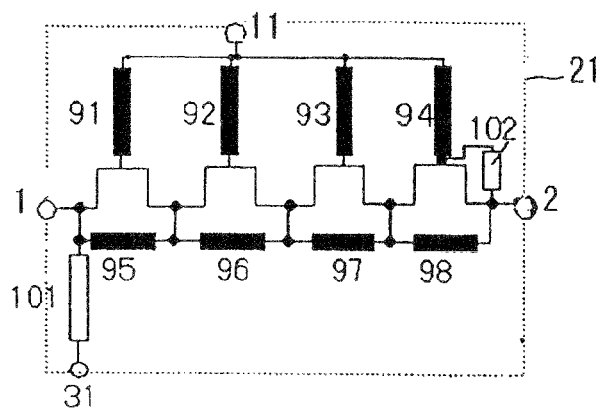
FIG. 13 is a circuit diagram showing a specific example of the first switch section and second switch section shown in FIG. 4.

The circuit shown in FIG. 13 has a configuration in which a resistance element is connected in parallel between the drain terminal and the source terminal of each of four FETs 51 through 54 shown in FIG. 11. Resistance element 95 is connected between the drain terminal and the source terminal of FET 51, resistance element 96 is connected between the drain terminal and the source terminal of FET 52, resistance element 97 is connected between the drain terminal and the source terminal of FET 53, and resistance element 98 is connected between the drain terminal and the source terminal of FET 54. The other configuration is the same as the circuit shown in FIG. 11.

Though in FIGS. 3 through 13, examples of circuits in which first switch section 21 includes one FET 51 or examples of circuits in which first switch section 21 includes four FETs 51 through 54 are shown, first switch section 21 may also take a configuration that includes two or more FETs connected in series. Also, the bias circuit may be inserted into any position as long as it can impart a potential difference between the drain terminal and the source terminal of each FET. Further, though in FIGS. 3 to 13, examples in which first switch section 21 includes one or two bias terminals are shown, first switch section 21 and second switch section 22 may each take a configuration that includes three or more bias terminals.

On the other hand, in first switch sections 21 shown in FIGS. 6, 8, 9, 11 and 13, configurational examples in which part of the bias circuits is connected between the gate terminal and the drain terminal or source terminal of an identical FET are shown. Since the gate terminals of FETs connected in series generally have the same d.c. potential, the bias circuit may also be connected between the gate terminal and the drain terminal or source terminal of a different FET as long as it can impart a potential difference between the drain terminal and source terminal of each FET.

Figure 14:
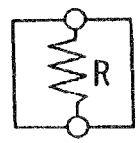
FIG. 14 is a circuit diagram showing a specific example of a bias circuit provided for the first switch section and second switch section shown in FIG. 4.
Figure 15:
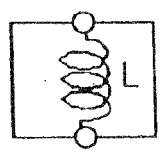
FIG. 15 is a circuit diagram showing a specific example of a bias circuit provided for the first switch section and second switch section shown in FIG. 4.
Figure 16:
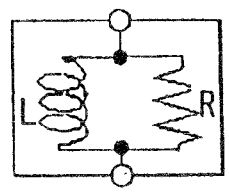
FIG. 16 is a circuit diagram showing a specific example of a bias circuit provided for the first switch section and second switch section shown in FIG. 4.

Bias circuits 101 through 105 shown in FIGS. 5 to 13 may employ the circuits shown in FIGS. 14 through 16, for example.

FIGS. 14 through 16 are circuit diagrams showing specific examples of the bias circuit included in the first switch section and the second switch section shown in FIG. 4.

FIG. 14 is an example using resistance element R as the bias circuit, and FIG. 15 is an example using inductance element L as the bias circuit. FIG. 16 is an example using resistance element R and inductance element L connected in parallel as the bias circuit. The bias circuit is not limited to the circuits shown in FIGS. 14 through 16, any circuit may be used as long as the d.c. voltage applied to one terminal is output from the other terminal. For example, a circuit including a series of resistance elements and inductance elements may also be used.

Figure 17:
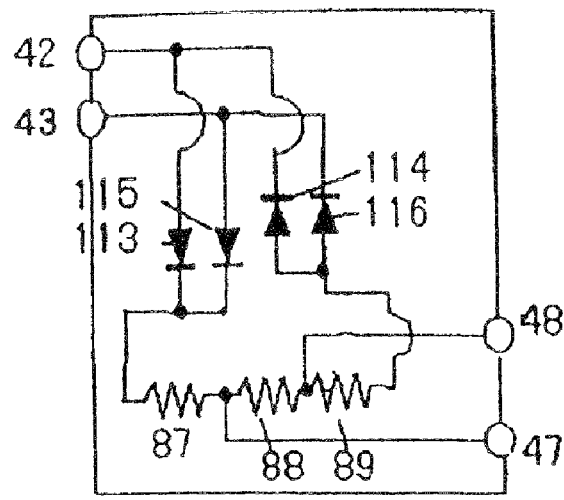
FIG. 17 is a circuit diagram showing a specific example of the potential generating circuit shown in FIG. 4.
Figure 18:
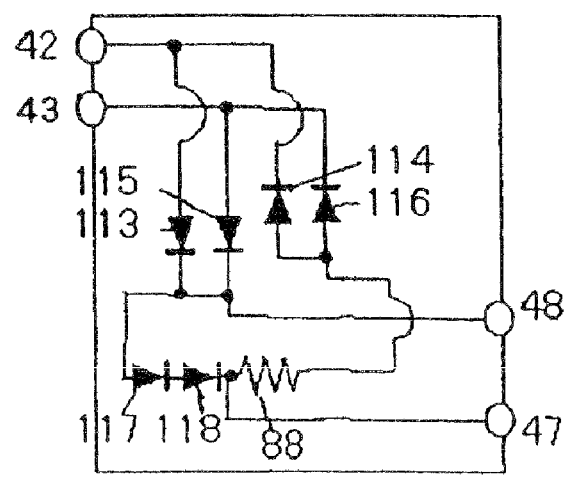
FIG. 18 is a circuit diagram showing a specific example of the potential generating circuit shown in FIG. 4.
Figure 19:
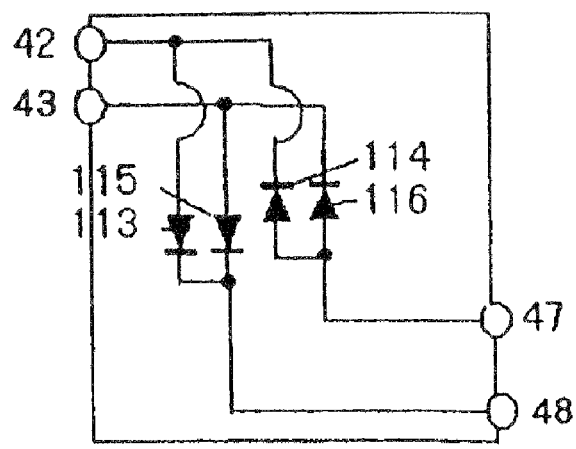
FIG. 19 is a circuit diagram showing a specific example of the potential generating circuit shown in FIG. 4.

Further, potential generating circuit 41 shown in FIG. 4 may use the circuits shown in FIGS. 17 through 19, for example.

FIGS. 17 through 19 are circuit diagrams showing specific examples of the potential generating circuit shown in FIG. 4.

The circuit shown in FIG. 17 has a configuration including four diodes 113 through 116 and resistance elements 87 through 89. The anode of diode 113 and the cathode of diode 114 are connected to input terminal 42, and the anode of diode 115 and the cathode of diode 116 are connected to input terminal 43. Serially connected resistance elements 87 through 89 are inserted between the cathode of diode 113 and diode 115 and the anode of diode 114 and diode 116. Further, the junction between resistance element 87 and resistance element 88 is connected to output terminal 47 while the junction between resistance element 88 and resistance element 89 is connected to output terminal 48.

The circuit shown in FIG. 18 has a configuration in which a serially connected diode 117, diode 118 and resistance element 88 are inserted between the cathode of diode 113 and diode 115 and the anode of diode 114 and diode 116 shown in FIG. 17. Further, the junction between the cathode of diode 118 and resistance element 88 is connected to output terminal 47 while the junction between the cathode of diode 113 and diode 115 and the anode of diode 117 is connected to output terminal 48. The other configuration is the same as the circuit shown in FIG. 17.

The circuit shown in FIG. 19 has a configuration including four diodes 113 through 116. The anode of diode 113 and the cathode of diode 114 are connected to input terminal 42, and the anode of diode 115 and the cathode of diode 116 are connected to input terminal 43. The cathode of diode 113 and diode 115 is connected to output terminal 48 while the anode of diode 114 and diode 116 is connected to output terminal 47.

Though FIGS. 17 through 19 show examples of circuits including two output terminals 47 and 48 in potential generating circuit 41, one of the output terminals alone may be used when first switch section 21 and second switch section 22 have one bias terminal (see FIGS. 6, 8, 11 and 13). Further, when first switch section 21 and second switch section 22 include three or more bias terminals, for example a resistance element and diode may be further inserted in series between the cathode of diode 113 and diode 115 and the anode of diode 114 and diode 116 shown in FIGS. 17 through 19 and the junctions may be used as the output terminals. Potential generating circuit 41 is not limited to the circuits shown in FIGS. 17 through 19. Any circuit may be used as long as it is a circuit that can produce one or more voltages from the control signal input to first switch section 21 and second switch section 22.

Figure 20:
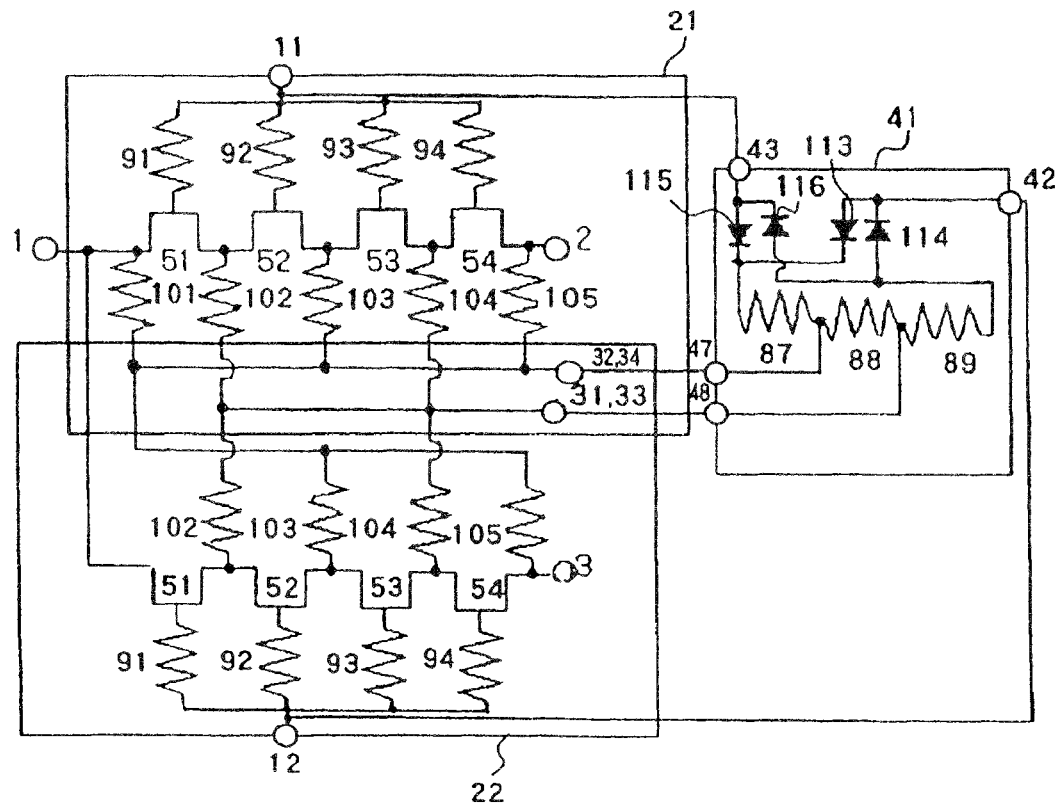
FIG. 20 is a circuit diagram showing one example of the high-frequency switch circuit shown in FIG. 4.
Figure 21:
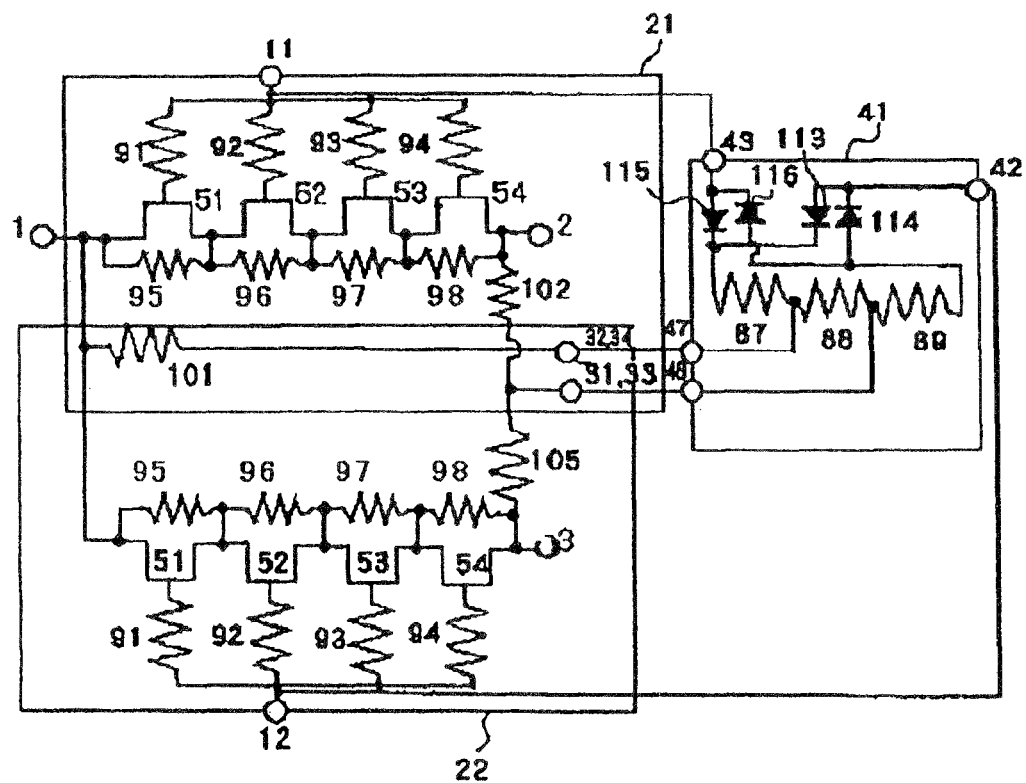
FIG. 21 is a circuit diagram showing one example of the high-frequency switch circuit shown in FIG. 4.

Referring next to FIGS. 20 and 21, the operation of the high-frequency switch circuit of the first exemplary embodiment will be described.

FIG. 20 is a circuit diagram showing an example in which the circuit shown in FIG. 7 is used as first switch section 21 and second switch section 22 shown in FIG. 4, the circuit shown in FIG. 14 is used as the bias circuits included in first switch section 21 and second switch section 22, and the circuit shown in FIG. 17 is used as potential generating circuit 41.

In the high-frequency switch circuit shown in FIG. 20, bias circuit 101 made of a resistance element is shared by first switch section 21 and second switch section 22. Further, in the high-frequency switch circuit shown in FIG. 20, bias terminal 31 of first switch section 21 and bias terminal 33 of second switch section 22 are used in common while bias terminal 32 of first switch section 21 and bias terminal 34 of second switch section 22 are used in common.

Figure 1:
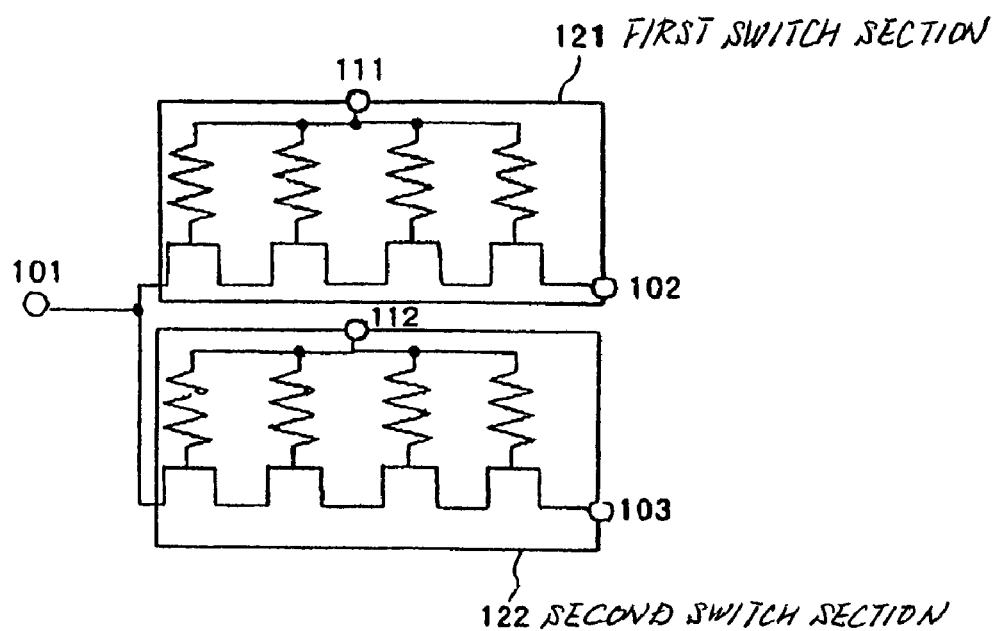
FIG. 1 is a circuit diagram showing one configurational example of a high-frequency switch circuit of the related art.
Figure 2:
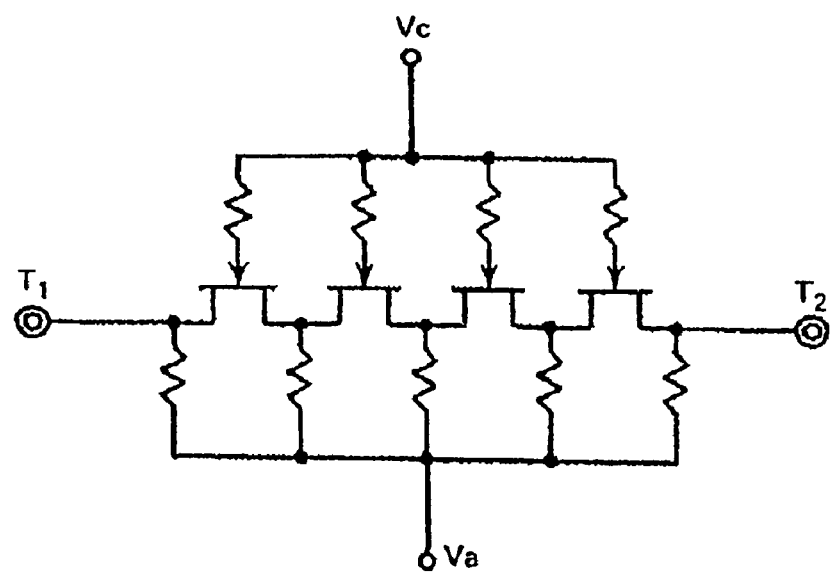
FIG. 2 is a circuit diagram showing another configurational example of a high-frequency switch circuit of the related art.
Figure 3:
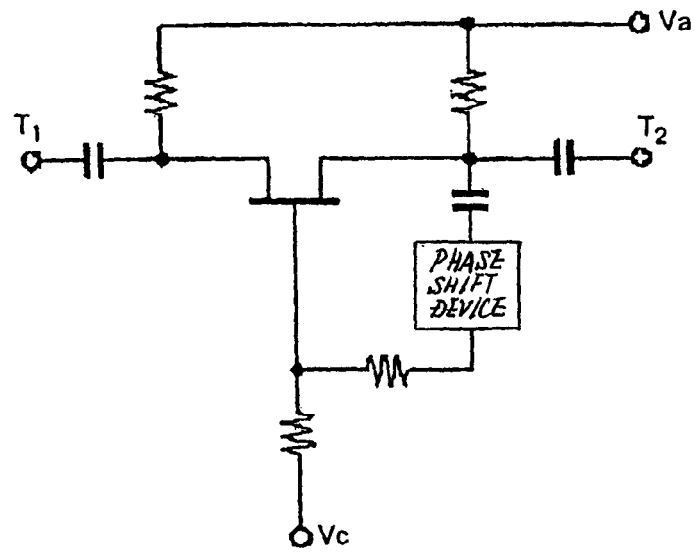
FIG. 3 is a circuit diagram showing another configurational example of a high-frequency switch circuit of the related art.

In the high-frequency switch circuit shown in FIG. 20, similarly to the high-frequency switch circuit of the related art shown in FIG. 1, two levels of control signals, high-level and low-level signals, are complementarily input to control terminal 11 of first switch section 21 and control terminal 12 of second switch section 22. Hereinbelow, the operation will be described taking a case in which the high-level control signal is input to control terminal 11 of first switch section 21 and the low-level control signal is input to control terminal 12 of second switch section 22.

When the high-level control signal is input to control terminal 11 in first switch section 21, all the serially connected FETs 51 through 54 are turned on. When the low-level control signal is input to control terminal 12 in second switch section 22, all the serially connected FETs 51 through 54 are turned off.

When the high-level control signal is input to control terminal 11 of first switch section 21 and the low-level control signal is input to control terminal 12 of second switch section 22, a high-level voltage is supplied to input terminal 43 of potential generating circuit 41 and a low-level voltage is supplied to input terminal 42.

When a high-level voltage is supplied to input terminal 43 and a low-level voltage is supplied to input terminal 42, potential generating circuit 41 applies a voltage approximately equal to the potential difference between the high level and the low level to serially connected resistance elements 87 through 89 by diodes 113 and 116. At this time, output terminal 47 and output terminal 48 output respective voltages that are divided by resistance elements 87 through 89.

The output voltage from output terminal 47 is supplied to bias terminal 32 of first switch section 21 and bias terminal 34 of second switch section 22 while the output voltage from output terminal 48 is supplied to bias terminal 31 of first switch section 21 and bias terminal 33 of second switch section 22.

Figure 22:
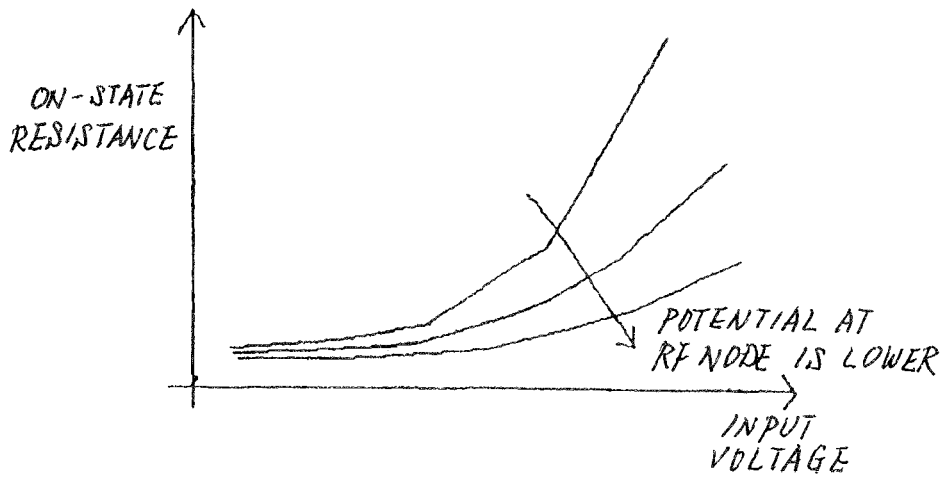
FIG. 22 is a diagram showing the effect of a high-frequency switch circuit of the first exemplary embodiment, and includes a graph showing the relations between FET on-state resistance and input voltage.
Figure 23:
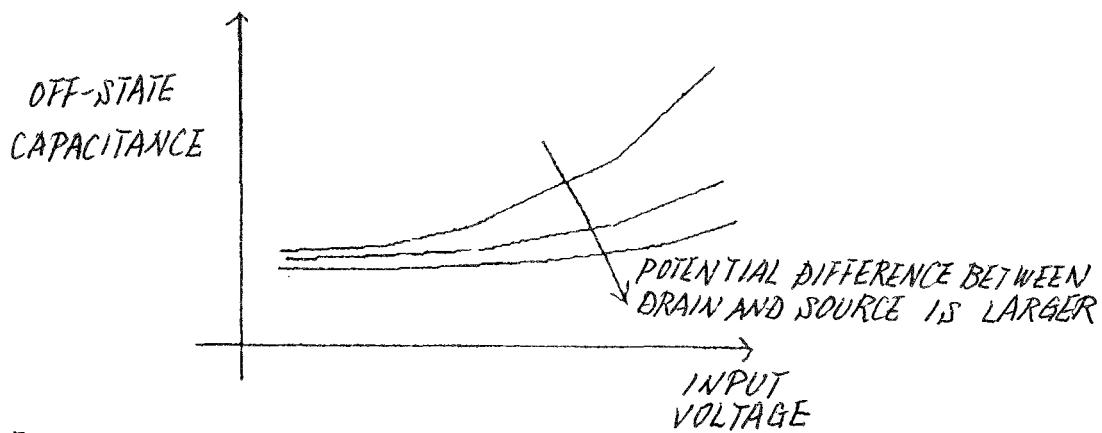
FIG. 23 is a diagram showing the effect of a high-frequency switch circuit of the first exemplary embodiment, and includes a graph showing the relations between FET off-state capacitance and input voltage.

Generally, the drain electrode and source electrode of each FET in the on-state provided in first switch section 21 have approximately the same potential as the high level applied to control terminal 11. However, in the circuit shown in FIG. 20, application of a voltage lower than the high-level voltage applied to control terminal 11 to bias terminals 31 and 32, causes the potential at the RF node to become lower and the applied voltage to the gate terminal to become higher. As a result, the on-state resistance of the FET that is in the on-state becomes lower as shown in FIG. 22, so that the variation of the FET on-state resistance relative to the variation of the input voltage input from the drain terminal or source terminal is suppressed. On the other hand, since the input resistance of each FET in the off-state provided in second switch section 22 is high, the voltages input to bias terminals 31 through 34 are applied as they are to the drain terminal and source terminal of each FET of second switch section 22. That is, it is possible to impart potential differences between the drain and source of the FETs in the off-state. As a result, the variation in the FET off-state capacitance relative to the variation of the input voltage is suppressed as shown in FIG. 23. Therefore, it is possible to reduce distortion of the high-frequency signal that arises when the signal passes through the high-frequency switch circuit shown in FIG. 20.

FIG. 21 is a circuit diagram showing an example in which the circuit shown in FIG. 12 is used as first switch section 21 and second switch section 22 shown in FIG. 4, the circuit shown in FIG. 14 is used as the bias circuit included in first switch section 21 and second switch section 22, and the circuit shown in FIG. 17 is used as potential generating circuit 41.

In the high-frequency switch circuit shown in FIG. 21, bias circuit 101 made of a resistance element is shared by first switch section 21 and second switch section 22. Further, in the high-frequency switch circuit shown in FIG. 21, bias terminal 31 of first switch section 21 and bias terminal 33 of second switch section 22 are used in common while bias terminal 32 of first switch section 21 and bias terminal 34 of second switch section 22 are used in common.

In the high-frequency switch circuit shown in FIG. 21, similarly to the high-frequency switch circuit of the related art shown in FIG. 1, two levels of control signals, high-level and low-level signals, are complementarily input to control terminal 11 of first switch section 21 and control terminal 12 of second switch section 22. Hereinbelow, the operation will be described taking a case in which the high-level control signal is input to control terminal 11 of first switch section 21 and the low-level control signal is input to control terminal 12 of second switch section 22.

When the high-level control signal is input to control terminal 11 in first switch section 21, all the serially connected FETs 51 through 54 are turned on. When the low-level control signal is input to control terminal 12 in second switch section 22, all the serially connected FETs 51 through 54 are turned off.

When the high-level control signal is input to control terminal 11 of first switch section 21 and the low-level control signal is input to control terminal 12 of second switch section 22, a high-level voltage is supplied to input terminal 43 of potential generating circuit 41 and a low-level voltage is supplied to input terminal 42.

When a high-level voltage is supplied to input terminal 43 and a low-level voltage is supplied to input terminal 42, potential generating circuit 41 applies a voltage approximately equal to the potential difference between the high level and the low level to serially connected resistance elements 87 through 89 by diodes 113 and 116. At this time, output terminal 47 and output terminal 48 output respective voltages that are divided by resistance elements 87 through 89.

The output voltage from output terminal 47 is supplied to bias terminal 32 of first switch section 21 and bias terminal 34 of second switch section 22 while the output voltage from output terminal 48 is supplied to bias terminal 31 of first switch section 21 and bias terminal 33 of second switch section 22.

Generally, the drain electrode and source electrode of each FET in the on-state provided in first switch section 21 have approximately the same potential as the high level applied to control terminal 11. However, in the circuit shown in FIG. 21, application of a voltage lower than the high-level voltage applied to control terminal 11 to bias terminals 31 and 32, causes the potential at the RF node to become lower and the applied voltage to the gate terminal to become higher. As a result, the on-state resistance of the FET that is in the on-state becomes lower as shown in FIG. 22, so that the variation of the FET on-state resistance relative to the variation of the input voltage input from the drain terminal or source terminal is suppressed. On the other hand, concerning high-frequency terminal 1 and high-frequency terminal 3 at both ends of second switch section 22, the voltages at bias terminals 31 and 32 are divided and applied through bias circuit 101 and bias circuit 102 to high-frequency terminal 1 in a manner similar to that described for the voltage at the RF node in the aforementioned first switch section 21, whereas the voltage at bias terminal 31 is applied to high-frequency terminal 3 through bias circuit 105. Applied to the drain terminal and source terminal of each FET that is in the off-state provided in second switch section 22 is a voltage that is obtained by dividing the voltages applied to the aforementioned high-frequency terminal 1 and high-frequency terminal 3 by resistance elements 95 through 98. That is, it is possible to impart potential differences between the drain and source of the FETs in the off-state. As a result, variation in the FET off-state capacitance relative to variation of the input voltage is suppressed as shown in FIG. 23. Therefore, it is possible to reduce distortion of the high-frequency signal that arises when the signal passes through the high-frequency switch circuit shown in FIG. 21.

The circuit shown in FIG. 12 that is used as first switch section 21 and second switch section 22 in the high-frequency switch circuit shown in FIG. 21 includes resistance elements 95 through 98 which each are connected in parallel between the drain terminal and source terminal of the FET. In contrast, the circuit shown in FIG. 10 does not include resistance elements 95 through 98. However, also in the circuit shown in FIG. 10, the voltage applied between the high-frequency terminals which are connected to both ends of a plurality of FETs serially connected is divided by the resistances of the FETs that are in the off-state, so that a potential difference arises between the drain terminal and the source terminal of each FET that is in the off-state. Accordingly, it is possible to obtain the same effect as in the case where the circuit shown in FIG. 12 is used.

Provision of resistance elements 95 through 98 in the switch portion as shown in FIG. 12 makes it possible to impart a potential difference between the drain terminal and the source terminal of each FET in a more stable manner than the case where the resistances of the FETs that are in the off-state, which are markedly high and depend on the applied voltage, are used. Accordingly, it is possible to impart a greater effect in reducing distortion. The configuration in which a resistance element is connected between the drain terminal and source terminal of the FET can be applied to any switch section shown in FIGS. 5 through 11. This situation is also the same as the second exemplary embodiment described below as well as in the first exemplary embodiment.

Here, any one of the circuits shown in FIGS. 5 through 13 may be used for first switch section 21 and second switch section 22, any one of the circuits shown in FIGS. 14 through 16 may be used for the bias circuit provided in first switch section 21 and second switch section 22, and any one of the circuits shown in FIGS. 17 through 19 may be used for potential generating circuit 41.

Here, first switch section 21 and second switch section 22 are constructed using one FET in the examples shown in FIGS. 5 and 6 whereas they are constructed using four FETs in the examples shown in FIGS. 7 through 13. However, the number of FETs that constitute these switch sections is not limited to these numbers shown in FIGS. 5 through 13. Besides, any combination of these circuits can lower the potential at the drain and source terminals of the FET that is in the on-state and impart a potential difference between the drain and source of the FET that is in the off-state, similarly to the circuits shown in FIGS. 20 and 21. As a result, variation of the on-state resistance of each FET that is in the on-state and variation of the off-state capacitance of the FET that is in the off-state can be suppressed, it is hence possible to reduce distortion of the high-frequency signal that arises when the signal passes through the high-frequency switch circuit.

Here, for each resistance element used for the bias circuit, it is preferable to use one that has high enough resistance so as to make the on-state resistance of the FET negligible and so that power loss due to leakage of the high-frequency signal through these resistance elements will not become large. However, the value of the resistance should be set at a value that is smaller than the off-state resistance of the FET and such that the voltage drop arising due to current flowing through the resistance element can be neglected.

Figure 24:
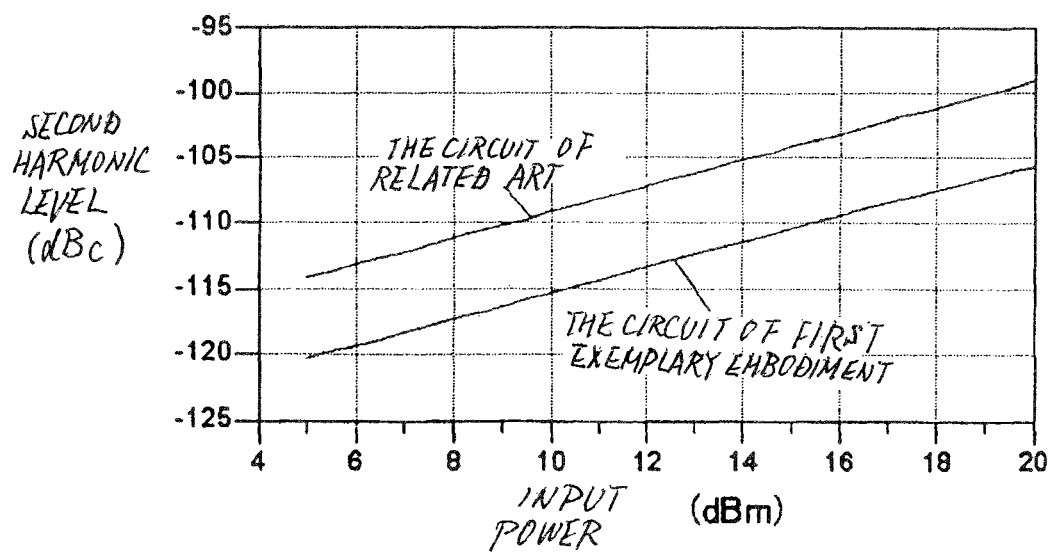
FIG. 24 is a diagram showing the effect of a high-frequency switch circuit of the first exemplary embodiment, and includes a graph showing how harmonic distortion is reduced.

FIG. 24 shows a result determined by simulating the levels of a high-harmonic (double frequency of the input frequency) level vs. the input power for the high-frequency switch circuit shown in FIG. 21 and the high-frequency switch circuit of the related art shown in FIG. 1. As shown in FIG. 24, it is understood that the high-harmonic of the high-frequency switch circuit of the first exemplary embodiment is improved by about 5 dBc compared to that of the high-frequency switch circuit of the related art.

The Second Exemplary Embodiment

Figure 25:
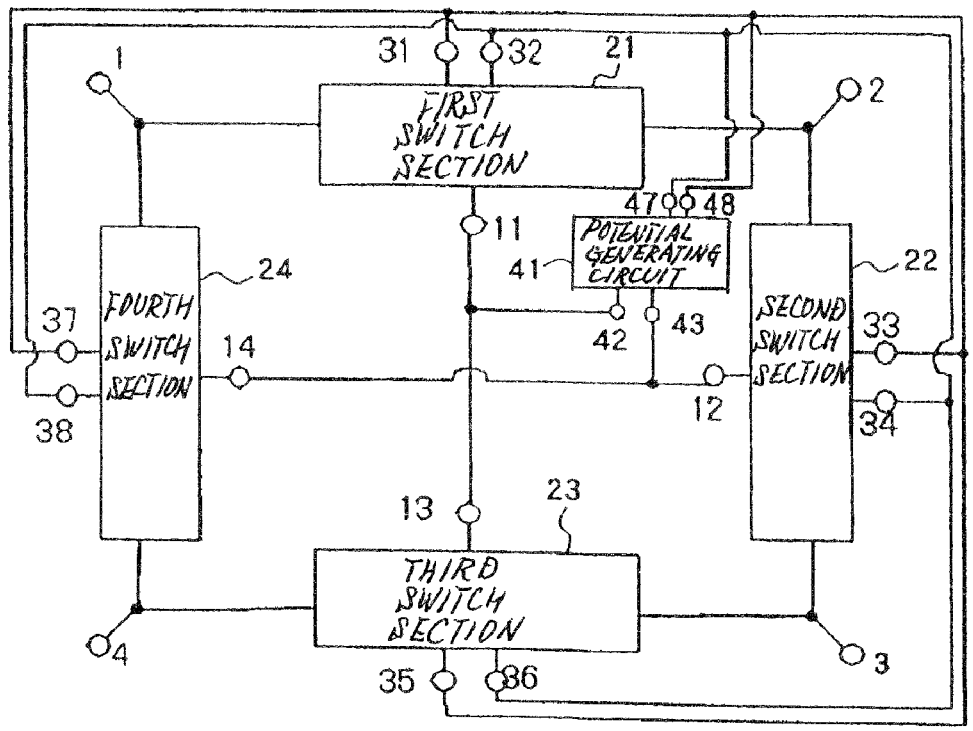
FIG. 25 is a block diagram showing a configuration of a high-frequency switch circuit of the second exemplary embodiment.

FIG. 25 is a block diagram showing a configuration of a high-frequency switch circuit of the second exemplary embodiment. Here, FIG. 25 is an example in which the configuration of the second exemplary embodiment is applied to a DPDT (double pole double through) type high-frequency switch circuit.

As shown in FIG. 25, the high-frequency switch circuit of the second exemplary embodiment includes: first switch section 21, second switch section 22, third switch section 23 and fourth switch section 24 for allowing a high-frequency signal to pass through or for cutting off a high-frequency signal; and a potential generating circuit 41 for supplying predetermined bias voltages to first switch section 21 through fourth switch section 24.

First switch section 21 is interposed between first high-frequency terminal 1 and second high-frequency terminal 2 for input and output of a high-frequency signal, and second switch section 22 is interposed between second high-frequency terminal 2 and fourth high-frequency terminal 3 for input and output of a high-frequency signal. Also, third switch section 23 is interposed between third high-frequency terminal 3 and fourth high-frequency terminal 4 for input and output of a high-frequency signal, and fourth switch section 24 is interposed between fourth high-frequency terminal 4 and first high-frequency terminal 1 for input and output of a high-frequency signal. As shown in FIG. 25, first switch section 21 trough fourth switch section 24 are arranged so as to be annularly connected by sharing high-frequency terminals with each other.

First switch section 21 includes control terminal 11 to which a control signal for allowing a high-frequency signal to pass through or for cutting off a high-frequency signal is input, and bias terminals 31 and 32 for supplying bias voltages to the circuit inside first switch section 21. Second switch section 22 includes control terminal 12 to which a control signal for allowing a high-frequency signal to pass through or for cutting off a high-frequency signal is input, and bias terminals 33 and 34 for supplying bias voltages to the circuit inside second switch section 22. Third switch section 23 includes control terminal 13 to which a control signal for performing on/off control is input, and bias terminals 35 and 36 for supplying bias voltages to the circuit inside third switch section 23. Fourth switch section 24 includes control terminal 14 to which a control signal for performing on/off control is input, and bias terminals 37 and 38 for supplying bias voltages to the circuit inside fourth switch section 24.

Bias terminal 32 of first switch section 21, bias terminal 34 of second switch section 22, bias terminal 36 of third switch section 23 and bias terminal 38 of fourth switch section 24 are connected to output terminal 47 from potential generating circuit 41, and bias terminal 31 of first switch section 21, bias terminal 33 of second switch section 22, bias terminal 35 of third switch section 23 and bias terminal 37 of fourth switch section 24 are connected to output terminal 48 from potential generating circuit 41.

Further, control terminal 11 of first switch section 21 and control terminal 13 of third switch section 23 are connected to input terminal 42 of potential generating circuit 41, and control terminal 12 of second switch section 22 and control terminal 14 of fourth switch section 24 are connected to input terminal 43 of potential generating circuit 41

First switch section 21 turns on and off in accordance with the control signal input from control terminal 11, and second switch section 22 turns on and off in accordance with the control signal input from control terminal 12. Similarly, third switch section 23 turns on and off in accordance with the control signal input from control terminal 13, and fourth switch section 24 turns on and off in accordance with the control signal input from control terminal 14.

Potential generating circuit 41 generates predetermined bias voltages based on the control signals input to control terminals 11 through 14 to supply them to first switch section 21 through fourth switch section 24, respectively.

Here, similarly to the first exemplary embodiment, the circuits shown in FIGS. 5 through 13, for example can be used for first switch section 21 through fourth switch section 24 shown in FIG. 25. Further, the circuits shown in FIGS. 14 through 16, for example can be used for the bias circuits provided for first switch section 21 through fourth switch section 24. Also, the circuits shown in FIGS. 17 through 19, for example, can be used for potential generating circuit 41 shown in FIG. 25.

Figure 26:
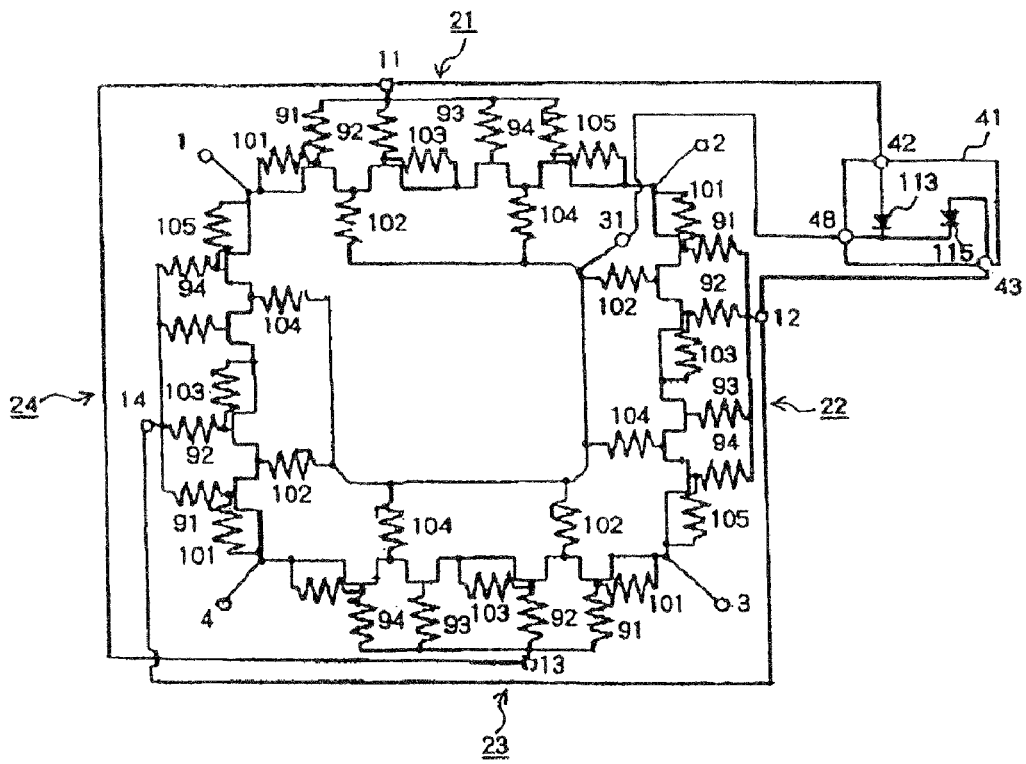
FIG. 26 is a circuit diagram showing one example of the high-frequency switch circuit shown in FIG. 20.

Referring next to FIG. 26, the operation of a high-frequency switch circuit of the second exemplary embodiment will be described.

FIG. 26 is an example in which the circuit shown in FIG. 8 is used as first switch section 21 through fourth switch section 24 shown in FIG. 25, the circuit shown in FIG. 14 is used as the bias circuits included in first switch section 21 through fourth switch section 24, and the circuit shown in FIG. 19 is used as potential generating circuit 41. Here, potential generating circuit 41 is an example that includes diodes 113 and 115 only.

In the high-frequency switch circuit shown in FIG. 26, since the circuit 735 shown in FIG. 8 is used for first switch section 21 through fourth switch section 24, the bias terminals provided for first switch section 21 through fourth switch section 24 are shared (bias terminal 31) and a bias voltage is supplied from output terminal 48 of potential generating circuit 41.

Hereinbelow, the operation will be described taking as an example the case in which the high-level control signal is input to control terminal 11 of first switch section 21 and control terminal 13 of third switch section 13 while the low-level control signal is input to control terminal 12 of second switch section 22 and control terminal 14 of fourth switch section 24.

When the high-level control signal is input to each of the control terminals, first switch section 21 and third switch section 23 turn on the associated serially connected FETs. On the other hand, when the low-level control signal is input to each of the control terminals, second switch section 22 and fourth switch section 24 turn off the associated serially connected FETs.

When the high-level control signal is input to control terminal 11 of first switch section 21 and control terminal 13 of third switch section 23 and the low-level control signal is input to control terminal 12 of second switch section 22 and control terminal 24, a high-level voltage is supplied to input terminal 42 of potential generating circuit 41 and a low-level voltage is supplied to input terminal 43.

When a high-level voltage is supplied to input terminal 42 and a low-level voltage is supplied to input terminal 43, potential generating circuit 41 produces a voltage in which the forward voltage of the diodes is lower than the high level voltage of diodes 113 and 115 and supplies it from output terminal 48 to bias terminal 31 that is shared by all the switch circuits.

In this case, in the circuit shown in FIG. 26, application of a lower voltage than the high-level voltage applied to control terminals 11 and 13 to bias terminal 31, causes the potential at the RF node to become lower and the applied voltage to the gate terminal to become higher. As a result, similarly to the first exemplary embodiment, the on-state resistance of the FET that is in the on-state becomes lower, and variation of the FET on-state resistance relative to variation of the input voltage input from the drain terminal or source terminal is suppressed. On the other hand, since the input resistance of each FET in the off-state, provided in second switch section 22 and fourth switch section 24 is high, the voltage supplied to bias terminal 31 is applied as it is to the drain terminal and source terminal of each FET of second switch section 22 and fourth switch section 24. That is, it is possible to impart potential differences between the drain and source of the FETs in the off-state. As a result, similarly to the first exemplary embodiment, variation in the FET off-state capacitance relative to variation of the input voltage input from the drain terminal or source terminal can be suppressed.

Similarly to the first exemplary embodiment, any one of the circuits shown in FIGS. 5 through 13 may be used for first switch section 21 through fourth switch section 24, any one of the circuits shown in FIGS. 14 through 16 may be used for the bias circuit provided in first switch section 21 through fourth switch section 24, and any one of the circuits shown in FIGS. 17 through 19 may be used for potential generating circuit 41. Here, first switch section 21 through fourth switch section 24 are constructed using one FET in the examples shown in FIGS. 5 and 6 whereas they are constructed using four FETs in the examples shown in FIGS. 7 through 13. However, the number of FETs that constitute these switch sections is not limited to these numbers shown in FIGS. 5 through 13. Besides, any combination of these circuits can lower the potential at the drain and source terminals of the FET that is in the on-state and impart a potential difference between the drain and source of the FET that is in the off-state, similarly to the circuit shown in FIG. 26. As a result, variation of the on-state resistance of each FET that is in the on-state and variation of the off-state capacitance of the FET that is in the off-state can be suppressed, it is hence possible to reduce distortion of the high-frequency signal that arises when the signal passes through the high-frequency switch circuit.

Here, for each resistance element used for the bias circuit, it is preferable to use one that has high enough resistance so as to make the on-state resistance of the FET negligible and so that power loss due to leakage of the high-frequency signal through these resistance elements will not become large. However, the value of the resistance should be set at a value that is smaller than the off-state resistance of the FET and such that the voltage drop arising due to the current flowing through the resistance element can be neglected.

Though the above first exemplary embodiment was described taking a SPDT as the example of a high-frequency switch circuit and the second exemplary embodiment was described taking a DPDT as the example of a high-frequency switch circuit, the configurations shown in the first exemplary embodiment and second exemplary embodiment can be applied to other high-frequency switch circuits having a plurality of ports.

Further, though in the first exemplary embodiment and the second exemplary embodiment, circuit examples using N-channel FETs for switch sections were shown, the switch sections can be configured using P-channel FETs. In this case, the circuit operates in the same manner if the polarity of the control signal is inverted.

The invention claimed is:

1. A high-frequency switch circuit for, in accordance with a high-level control signal voltage, allowing a high-frequency signal to pass through or cutting off the high-frequency signal, the switch circuit comprising:
   a switch section, including i) a field effect transistor configured to turn on and off in accordance with said high-level control signal voltage applied via a plurality of respective resistance elements, said switch section forming a passage route of said high-frequency signal, and ii) a plurality of bias circuits for applying different bias voltages that are lower than the high-level voltage of said control signal and that produce a potential difference between a drain terminal and a source terminal of said field effect transistor; and
   a potential generating circuit for generating said bias voltages from said control signal voltage and supplying said bias voltages to said bias circuits.

2. The high-frequency switch circuit according to claim 1, wherein
   said switch section includes a plurality of serially connected field effect transistors that turn on and off in accordance with said control signal voltage applied via a plurality of respective said resistance elements and that form the passage route of said high-frequency signal, and
   said bias circuits are each arranged so as to be connected to every junction where the drain terminal and the source terminal of said plurality of field effect transistors are connected.

3. The high-frequency switch circuit according to claim 2, wherein at least one bias circuit from among the bias circuits is disposed between a gate terminal of the field effect transistor and a junction.

4. The high-frequency switch circuit according to claim 1, wherein
said switch section includes a plurality of the field effect transistors serially connected to each other configured to turn on and off in accordance with said control signal voltage applied via a plurality of said resistance elements, and
said bias circuits are respectively arranged at two junctions where one of a drain terminal and a source terminal are located, each of the two junctions being at opposite ends of the series of said plurality of field effect transistors where input/output terminals of said high-frequency signal are connected.

5. The high-frequency switch circuit according to claim 1, wherein
said switch section includes a plurality of the field effect transistors serially connected to each other configured to turn on and off in accordance with said control signal voltage applied via a plurality of said resistance elements,
a first bias circuit is arranged at a junction where one of a drain terminal and a source terminal located at a first end of the series of said plurality of field effect transistors and where an input/output terminal of said high-frequency signal is connected, and
a second bias circuit is arranged between one of a drain terminal and a source terminal located at a second end of the series of field effect transistors and a gate terminal.

6. The high-frequency switch circuit according to claim 1, further comprising:
a resistance element that is connected in parallel with the drain terminal and the source terminal of said field effect transistor.

7. The high-frequency switch circuit according to claim 1, wherein said potential generating circuit includes a diode for supplying at least one bias voltage, from among the bias voltages, as a voltage in which a turn-on voltage of said diode is lower than the high-level voltage of said control signal.

8. The high-frequency switch circuit according to claim 7, wherein said potential generating circuit includes a plurality of resistance elements for voltage-dividing the output voltage via said diode to supply the at least one bias voltage.

9. The high-frequency switch circuit according to claim 1, wherein at least one bias circuit from among the bias circuits is a resistance element.

10. The high-frequency switch circuit according to claim 1, wherein at least one bias circuit from among the bias circuits is an inductance element.

11. The high-frequency switch circuit according to claim 1, wherein at least one bias circuit from among the bias circuits is a parallel circuit of a resistance element and an inductance element.

12. A high-frequency switch circuit, comprising:
two of the switch sections according to claim 1, the two switch sections sharing a high-frequency terminal through which said high-frequency signal is input and output; and
a potential generating section configured to supply at least one bias voltage, from among the bias voltages, to said two switch sections.

13. A high-frequency switch circuit, comprising:
four of the switch sections according to claim 1 connected in an annular form by sharing a high-frequency terminal through which said high-frequency signal is input and output; and
a potential generating circuit configured to supply at least one bias voltage, from among the bias voltages, to said four switch sections.

* * * * *